US 6,700,206 B2

(12) United States Patent
Kinsman

(10) Patent No.: US 6,700,206 B2
(45) Date of Patent: Mar. 2, 2004

(54) STACKED SEMICONDUCTOR PACKAGE AND METHOD PRODUCING SAME

(75) Inventor: Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/211,021

(22) Filed: Aug. 2, 2002

(65) Prior Publication Data

US 2004/0021229 A1 Feb. 5, 2004

(51) Int. Cl.[7] .................. H01L 23/495; H01L 29/40
(52) U.S. Cl. ............... 257/777; 257/669; 257/670; 257/666; 257/781; 257/784
(58) Field of Search .................. 257/666, 669, 257/670, 781, 777, 784

(56) References Cited

U.S. PATENT DOCUMENTS

| | | | |
|---|---|---|---|
| 5,012,323 A | | 4/1991 | Farnworth |
| 5,140,404 A | * | 8/1992 | Fogal et al. ............... 257/783 |
| 5,291,061 A | | 3/1994 | Ball |
| 5,331,235 A | | 7/1994 | Chun |
| 5,424,576 A | * | 6/1995 | Djennas et al. ........... 257/666 |
| 5,521,427 A | * | 5/1996 | Chia et al. ................ 257/666 |
| 5,804,874 A | | 9/1998 | An et al. |
| 5,814,881 A | * | 9/1998 | Alagaratnam et al. ...... 257/686 |
| 5,998,864 A | | 12/1999 | Khandros et al. |
| 6,005,778 A | * | 12/1999 | Spielberger et al. ........ 361/770 |
| 6,087,718 A | | 7/2000 | Cho |
| 6,104,089 A | | 8/2000 | Akram |
| 6,150,724 A | * | 11/2000 | Wenzel et al. ............ 257/777 |
| 6,207,474 B1 | | 3/2001 | King et al. |
| 6,252,299 B1 | | 6/2001 | Masuda et al. |
| 6,303,981 B1 | | 10/2001 | Moden |
| 6,337,510 B1 | | 1/2002 | Chun-Jen et al. |
| 6,373,447 B1 | * | 4/2002 | Rostoker et al. .......... 257/666 |
| 6,437,449 B1 | * | 8/2002 | Foster .................. 257/777 |
| 6,440,779 B1 | * | 8/2002 | Chiu et al. ............... 438/123 |
| 6,545,365 B2 | * | 4/2003 | Kondo et al. ............ 257/777 |
| 6,552,416 B1 | * | 4/2003 | Foster .................. 257/666 |
| 6,555,902 B2 | * | 4/2003 | Lo et al. ................ 257/686 |
| 2003/0092205 A1 | * | 5/2003 | Wu et al. ............... 257/777 |

OTHER PUBLICATIONS

U.S. patent application Ser. No. 10/093,332, Todd O. Bolken, filed Mar. 7, 2002.

* cited by examiner

*Primary Examiner*—Jasmine Clark
(74) *Attorney, Agent, or Firm*—TraskBritt

(57) ABSTRACT

A semiconductor device package and method of fabricating same. The package includes a lead frame having a die paddle and a plurality of lead fingers. The active surface of a first semiconductor die is adhered to the underside of the die paddle and is electrically coupled with one or more of the plurality of lead fingers. A second semiconductor die may be adhered to the upper side of the die paddle along a surface which is opposite to its active surface and is electrically coupled with one or more of the plurality of lead fingers. The die paddle may be formed to exhibit a smaller peripheral outline than that of the first semiconductor die such that the die paddle does not interfere with any peripherally located bond pads of the first semiconductor die. The die paddle may further serve as a heat spreader, resulting in a more thermally stable package.

49 Claims, 7 Drawing Sheets

STACKED SEMICONDUCTOR PACKAGE AND METHOD PRODUCING SAME

BACKGROUND OF THE INVENTION

1. Field of the Invention

The present invention relates generally to semiconductor device packages that employ multiple semiconductor dice. More specifically, the present invention relates to methods and apparatus for increasing integrated circuit density by employing a plurality of semiconductor dice in semiconductor packages while utilizing a single lead frame.

2. State of the Art

High performance, low cost, increased miniaturization of components, and greater packaging density of integrated circuits have long been the goals of the computer industry. Greater integrated circuit density, for a given level of active component and internal conductor density, is conventionally limited by the space available within a packaging envelope and by the surface area, or "real estate," available on a carrier substrate such as a printed circuit board. In addition, simplicity and reduced processing of semiconductor die assemblies are preferable. For instance, reduction of parts and processing steps reduces the cost of semiconductor components.

For conventional lead frame-mounted semiconductor dice, space limitations are a result of the basic design. Conventional lead frame design inherently limits potential single-die package density because the die-attach paddle of the lead frame is conventionally as large as or larger than the die residing on the paddle. The larger the die, the less space (relative to size of the die) that remains around the periphery of the die-attach paddle for forming the requisite electrical connections such as with wire bonds and for encapsulation by packaging material.

One known method of increasing integrated circuit density is set forth in U.S. Pat. No. 5,012,323 to Farnworth. Farnworth teaches the combining of a pair of dice mounted on opposing sides of a lead frame. An upper die is back-bonded to the upper surface of the leads of the lead frame via a first adhesively coated, insulated film layer. The lower die is face-bonded to the lower lead frame die-bonding region via a second, adhesively coated, insulative, film layer. The bond pads on both the upper die and lower die are interconnected with the ends of their associated lead extensions with gold or aluminum bond wires. The lower die is slightly larger than the upper die so that the lower die bond pads are accessible from above through an aperture in the lead frame such that wire bonds can be made from these bond pads to lead extensions. However, this arrangement has a major disadvantage from a production standpoint, since differently sized dice are required. Furthermore, such a design may allow for a build-up of thermal energy between the two dice and does not provide an effective means of dissipating such thermal energy. Additionally, the use of differently sized dice tends to yield a mechanically and thermally unbalanced package. For example, the two differently sized dice may generate and dissipate heat at different rates and may also expand and contract at different rates, resulting in undesirable stress/strain patterns within the package.

U.S. Pat. No. 5,291,061 to Ball teaches a multiple stacked die device that contains up to four dice and which does not exceed the height of then-current single die packages. The low profile of the device is achieved by close-tolerance stacking, which is made possible by a low-loop-profile wire bonding operation and thin-adhesive layers between the dice of the stack. However, although Ball secures all of the dice to a single lead frame, the wire bonds tend to become excessively long and/or the lead frame must be modified to accommodate the wire bonding of the upper semiconductor dice. Further, such an arrangement may again yield a thermally unbalanced package, particularly with only one die of the plurality of dice being disposed on the die paddle of the lead frame.

U.S. Pat. No. 5,804,874 to An et al. discloses the stacking of two or more identical leads-over-chip ("LOC") configured semiconductor dice facing in the same direction. A lower die is adhered by its active surface to leads of a lower lead frame and wire bonded in LOC fashion, after which the active surface of at least one other die is adhered to leads of an upper lead frame in LOC fashion, then adhesively back bonded to the upper surface of the lower lead frame. The leads of the upper lead frame are electrically connected to those of the lower lead frame by thermocompression bonding. The An device, while providing increased circuit density, requires at least two differently configured LOC lead frames and that bond pads of both dice be wire bonded to their corresponding leads before the at least two dice are secured together. Moreover, the asymmetrical die arrangement and coverage of the wire bonds of the lower die by the upper die may induce an irregular flow front of filled polymer encapsulant material as the assembly is encapsulated by transfer molding, resulting in incomplete encapsulation without voids and increased probability of bond wire sweep and consequent shorting.

U.S. Pat. No. 6,252,299 to Masuda et al. discloses an LOC-type semiconductor package wherein an upper die and a lower die, each with centrally located bond pads, are electrically connected to separate lead fingers of respective lead frames. In addition, the upper and lower dice are configured such that the circuit-bearing or active surfaces of each die are opposed to each other. Thus, the Masuda invention employs multiple lead frames, adding to the material and processing costs and complexities of the packaged device. Further, the upper and lower dice are arranged in a back-to-back configuration and present issues of thermal energy build-up similar to those discussed above.

U.S. Pat. No. 6,087,718, issued to Cho, discloses a stacked-type semiconductor package wherein an upper die with peripherally located bond pads and a lower die with centrally located bond pads are electrically connected to a single lead frame. However, the use of differently configured semiconductor dice in Cho may be somewhat undesirable as it requires a specially configured lead frame which is amenable to the attachment and operative connection of two differently configured semiconductor dice. Further, as discussed above, differing rates of heat generation, heat dissipation, expansion and contraction may result from the use of two differently sized and configured dice.

U.S. patent application Ser. No. 10/093,332, entitled METHODS AND APPARATUS FOR PACKAGING SEMICONDUCTOR DEVICES, applied for by Bolken and assigned to the Assignee of the present invention, discloses the stacking of two similarly configured semiconductor dice facing in the same direction. A lower die is adhered by its active surface to the leads of a lead frame and wire bonded in an LOC fashion. The second die is adhesively back bonded to the upper surface of the lead frame and is electrically connected to the lead frame by means of wire bonds which extend from the centrally located bond pads of the second die outwardly beyond the periphery thereof. The Bolken device, while providing increased circuit density, requires wire bonds of excessive length and may require specially configured wire bonds to maintain proper structural rigidity throughout the length of the wires used in forming such bonds.

Thus, it would be advantageous to develop a technique and device for increasing integrated circuit density in a semiconductor device package utilizing multiple semiconductor dice that are electrically bonded to a single lead frame.

In would further be advantageous if such a package could be assembled and fabricated using conventional components and conventional processes such that the package may be produced in current facilities without substantial disruption of current work flow processes.

It would also be advantageous if such a semiconductor package device allowed for increased dissipation of heat or thermal energy that tends to build up in multiple-die packages. For example, it would be advantageous to provide a thermally and mechanically balanced package.

BRIEF SUMMARY OF THE INVENTION

In accordance with one aspect of the invention, a semiconductor device package is provided. The package includes a lead frame including a die paddle and a plurality of lead fingers and a first semiconductor die having an active surface and a plurality of bond pads disposed on the active surface. The active surface of the first semiconductor die is adhered to an underside of the die paddle and at least one of the plurality of bond pads is electrically connected to at least one of the plurality of lead fingers.

The semiconductor device package may further comprise a second semiconductor die having an active surface, a surface opposing the active surface and a plurality of bond pads disposed on the active surface. The opposing surface of the second semiconductor die may be adhered to the upper side of the die paddle with at least one of the plurality of bond pads being electrically coupled with at least one of the lead fingers.

The first semiconductor die and second semiconductor die may be substantially identical to one another and have corresponding bond pads commonly electrically coupled with specified lead fingers.

A thermally conductive material may be used to adhere one or more of the semiconductor dice with the die paddle to increase heat transfer to the die paddle and through any tie bars coupled therewith.

In accordance with another aspect of the present invention, another semiconductor device package is provided. The semiconductor device package includes a lead frame having a centrally located die paddle and a plurality of lead fingers arranged about a periphery of the die paddle. A first semiconductor die having an active surface and a plurality of bond pads disposed on the active surface is adhered to the underside of the die paddle along its active surface. A second semiconductor die having an active surface, a second opposing surface and a plurality of bond pads disposed on the active surface thereof is adhered to the upper side of the die paddle along its second opposing surface. A first electrical connection is formed between a first bond pad of the plurality of bond pads of the first semiconductor die and a first lead finger of the plurality of lead fingers. A second electrical connection is formed between a first bond pad of the plurality of bond pads of the second semiconductor die and a second lead finger of the plurality of lead fingers.

In accordance with another aspect of the present invention, a method of forming a semiconductor device package is provided. The method includes providing a lead frame having a die paddle and a plurality of lead fingers. The active surface of a first semiconductor die is then adhered to the underside of the die paddle. At least one of a plurality of bond pads formed on the active surface of the first semiconductor die is electrically connected with a first lead finger of the plurality of lead fingers.

In accordance with yet other aspects of the present invention, a memory device and a computing system are provided. The memory device and computing system each include at least one semiconductor device package configured as set forth herein.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1A:
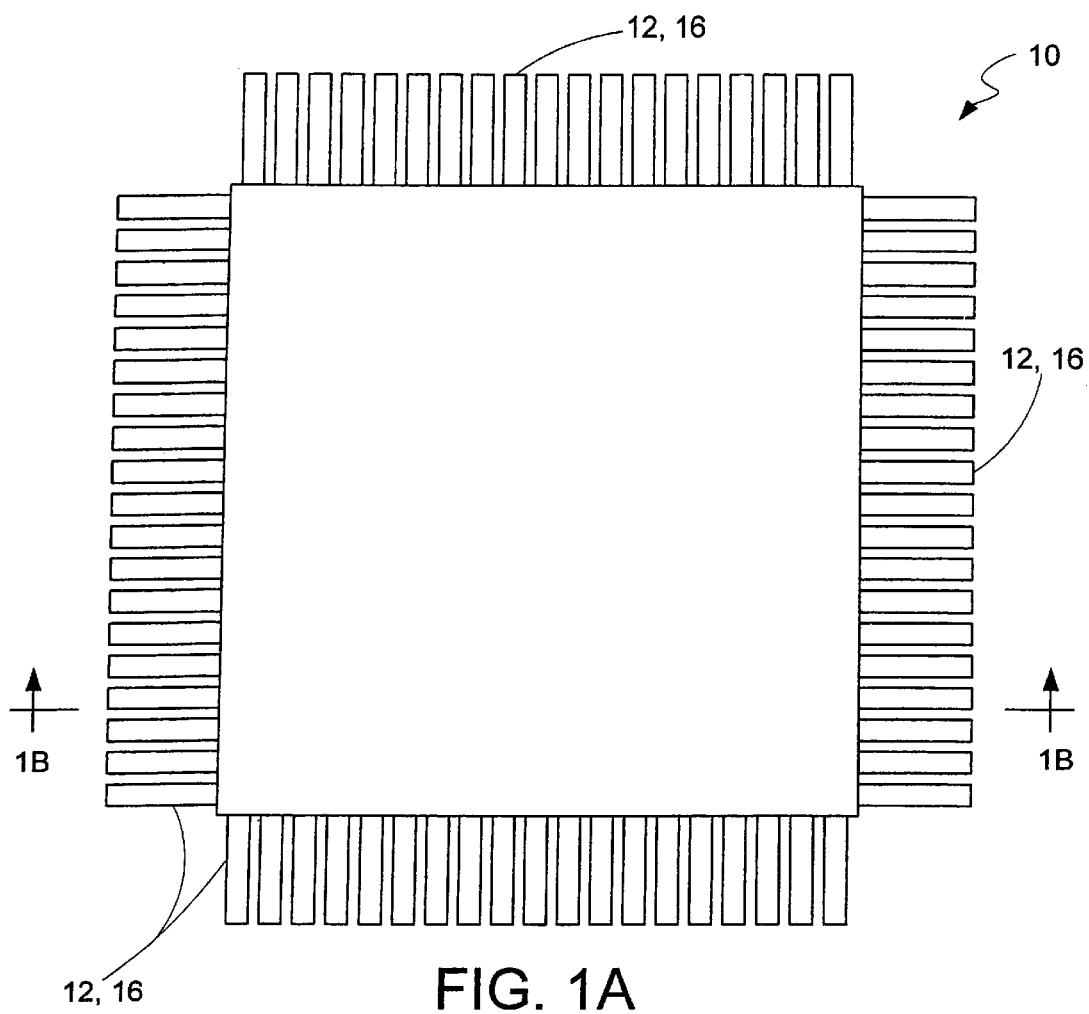
FIGS. 1A and 1B show plan and partial cross-sectional views respectively of a packaged semiconductor device according to an embodiment of the present invention.
Figure 1B:
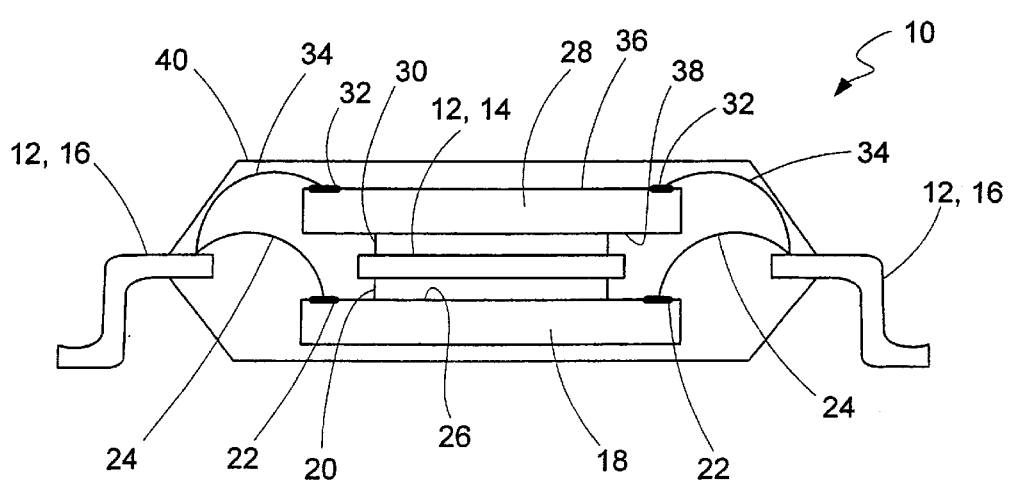

Referring to FIGS. 1A and 1B, a semiconductor device package 10 is shown. The package is shown as a thin quad flat package (TQFP); however, the present invention may be practiced with other types of packages such as, for example, quad flat packages (QFP), thin small outline packages (TSOP), small outline packages (SOP) or small outline j-leaded (SOJ) packages.

The semiconductor device package 10 includes a lead frame 12 which, other than a few modifications which shall be set forth in greater detail below, includes a conventional chip-on-leads (COL)-type lead frame configured with a centrally located die paddle 12 and a plurality of lead fingers 16 peripherally located relative to the die paddle 14. The lead frame 14 may be made from materials and by processes known to those of ordinary skill in the art. For example, copper and copper alloys are suitable materials, and may be stamped or etched from sheet form to define strips of lead frames.

A first semiconductor die 18 is adhered to the underside of the die paddle 14 by means of an adhesive spacer 20. The adhesive spacer 20 may be formed of a material such as, for example, polyimide tape or as an epoxy blanket disposed between the first semiconductor die 18 and the die paddle 14. As will become more apparent from the description below, it may be desirable to make the adhesive spacer 20 from a material that exhibits a measure of thermal conductivity.

The first semiconductor die 18 further includes a plurality of peripherally located bond pads 22 electrically coupled to circuitry (not shown) formed within the semiconductor die 18 as will be appreciated by those of ordinary skill in the art. The bond pads 22 are further electrically coupled to the lead fingers 16 of the lead frame 12 such as through wire bonds 24. The wire bonds 24 may be formed of materials and by processes as known to those of ordinary skill in the art. It is noted that the first semiconductor die 18 is adhered to the underside of the die paddle 14 along its active surface 26, also referred to as its face or face surface.

A second semiconductor die 28 is adhered to the upper side of the die paddle 14 by means of an adhesive spacer 30 in a manner similar to that of the first semiconductor die 18. The second semiconductor die 28 also includes a plurality of peripherally located bond pads 32 which are electrically coupled to internal circuitry (not shown) and which are further electrically coupled to lead fingers 16 of the lead frame 12 such as with wire bonds 34. It is noted that the second semiconductor die 28 is not coupled to the die paddle 14 along its active surface 36 but rather along an opposing surface 38, also referred to as its back side or back surface.

The first and second semiconductor dice 18 and 28, the die paddle 14 and a portion of the plurality of lead fingers 16 are each encapsulated with dielectric material 40, as by transfer molding with a filled polymer, which serves to protect the semiconductor dice 18 and 28 and the wire bonds 24 and 34. The lead fingers 16 may be bent or exhibit various configurations for electrical connection with, for example, contact pads of a circuit board as will be appreciated by those of skill in the art.

The semiconductor device package 10 provides for higher circuit density by stacking two semiconductor dice 18 and 28 within a single package 10, utilizing a single lead frame 12 with conventional components and conventional fabrication equipment. Thus, it is noted that the present invention enables the use of identical semiconductor dice 18 and 28 rather than requiring dice which are mirrored images of each other in terms of bond pad arrangements and power, ground and input/output configurations. With the semiconductor dice 18 and 28 being identical devices, including the circuitry and bond pad arrangements, corresponding bond pads 22 and 32 from the two semiconductor dice 18 and 28 may be wired to common lead fingers 16.

Alternatively, corresponding bond pads 22 and 32 of the semiconductor dice 18 and 28 may be electrically coupled to individual and distinct lead fingers 16, depending on the operational design and intended use of the semiconductor device package 10.

It is further noted that, regardless of whether corresponding, peripherally located bond pads 22 and 32 of the two semiconductor dice 18 and 28 are coupled to common or to distinct lead fingers 16, the arrangement or configuration of the semiconductor dice 18 and 28 within the package 10 allows the wire bonds 24 and 34 to exhibit substantially similar lengths, both of which are relatively short (e.g., in comparison to wire bonds extending from centrally located bond pads) such that additional processing or special materials are not required to ensure the strength and integrity of the wire bonds 24 and 34.

Furthermore, the use of a single lead frame 12 reduces the number of parts and materials used in the package. Also, the use of a COL-type lead frame allows the die paddle 14 to be used as a spacer between the two semiconductor dice 18 and 28 and may also function as a heat spreader due to its thermally conductive properties. Such an arrangement provides a thermally superior package 10 in comparison to prior art devices.

In order to make a package 10 including two semiconductor dice 18 and 28 which is approximately the same size as a similar package having only a single semiconductor die, the semiconductor dice 18 and 28 may be formed to be relatively thinner when viewing a transverse cross section (i.e., the height of the semiconductor dice 18 and 28 shown in FIG. 1B). For example, a conventional semiconductor die used in a single die package may have a thickness of approximately 300 microns (approximately 0.012 inch) while the semiconductor dice 18 and 28 used in the present package 10 may exhibit thicknesses of approximately 150 to 200 microns (approximately 0.006 to 0.008 inch) and may even be as thin as approximately 75 microns (approximately 0.003 inch). Thinning of semiconductor dice 18 and 28 may be accomplished, for example, through back-grinding, abrasive planarization techniques such as chemical-mechanical planarization (CMP), etching or an atmospheric downstream plasma (ADP) process offered by Tru-Si Technologies of Sunnyvale, Calif., which is known by those of ordinary skill in the art.

Figure 2:
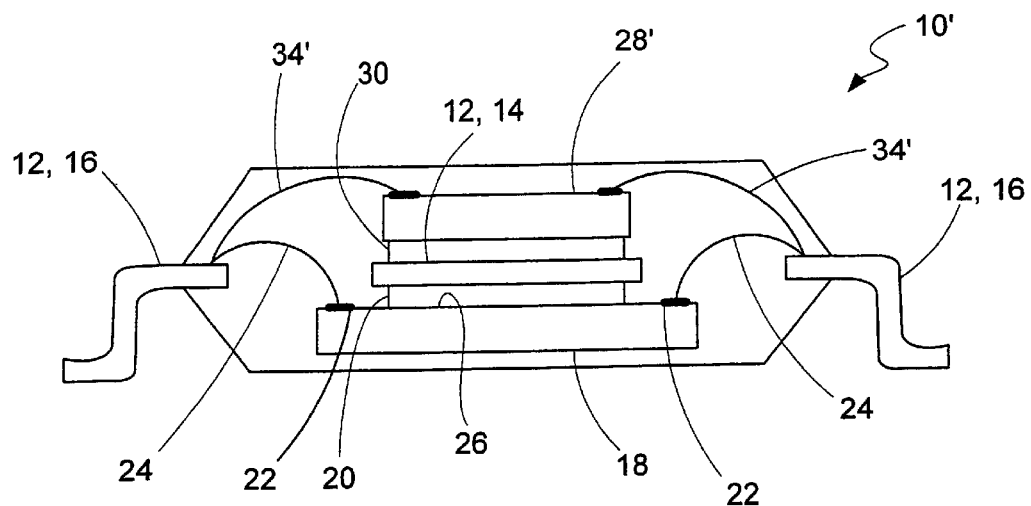
FIG. 2 shows a partial cross-sectional view of a packaged semiconductor device according to another embodiment of the present invention.

It is also noted that, while the semiconductor device package 10 is shown as including two semiconductor dice 18 and 28 which are similarly sized, two differently sized dice may be used in a semiconductor device package 10' as shown in FIG. 2. For example, the second (or upper) semiconductor die 28' may be smaller than the first (or lower) semiconductor die 18. Even if differently sized, the two semiconductor dice 18 and 28' may be configured with similar circuitry and bond pad arrangements. Such is often the case when, in industry, dice "shrink" from one generation to another of the same circuit configuration and packages may be scaled down or reduced in size. Thus, the similar semiconductor dice are available in multiple sizes during industry's transition to the newly reduced-size die and attendant package. It is noted that such a configuration may require a wire bond 34' of a different length or, perhaps, exhibit a smaller radius in electrically coupling the second semiconductor die 28' with the lead frame 12.

Further, while the package of the present invention has been described above utilizing two similarly configured dice, two differently configured dice may likewise be employed in the present invention. For example, two similarly sized dice which each include different circuitry and different bond pad arrangements may be used in the package 10'. Of course, two differently sized dice which employ different circuitry may also be utilized in a single package 10' of the present invention.

Figure 3:
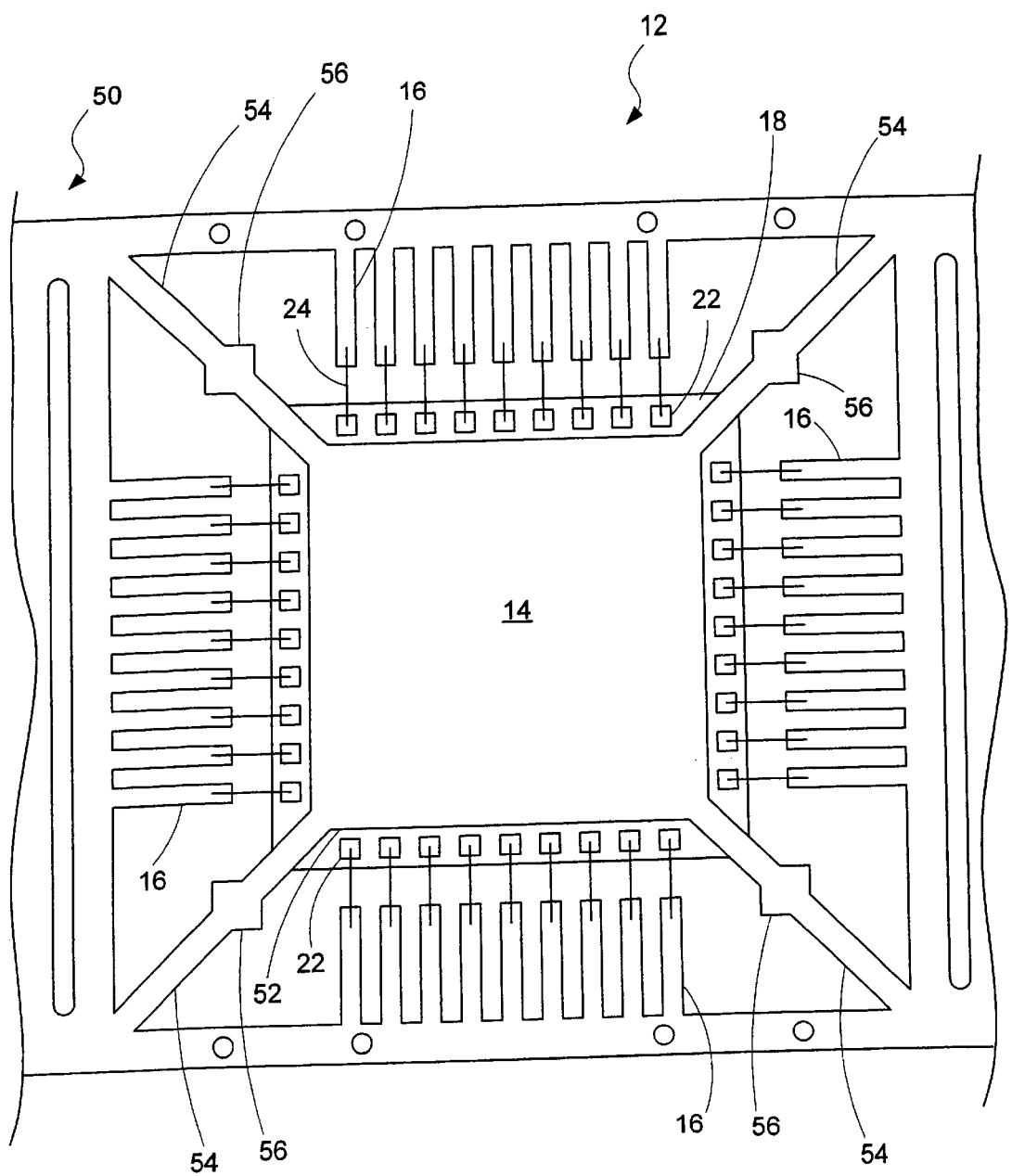
FIG. 3 shows a top elevational view of a lead frame having a semiconductor die attached to the bottom side thereof according to an embodiment of the present invention.
Figure 4:
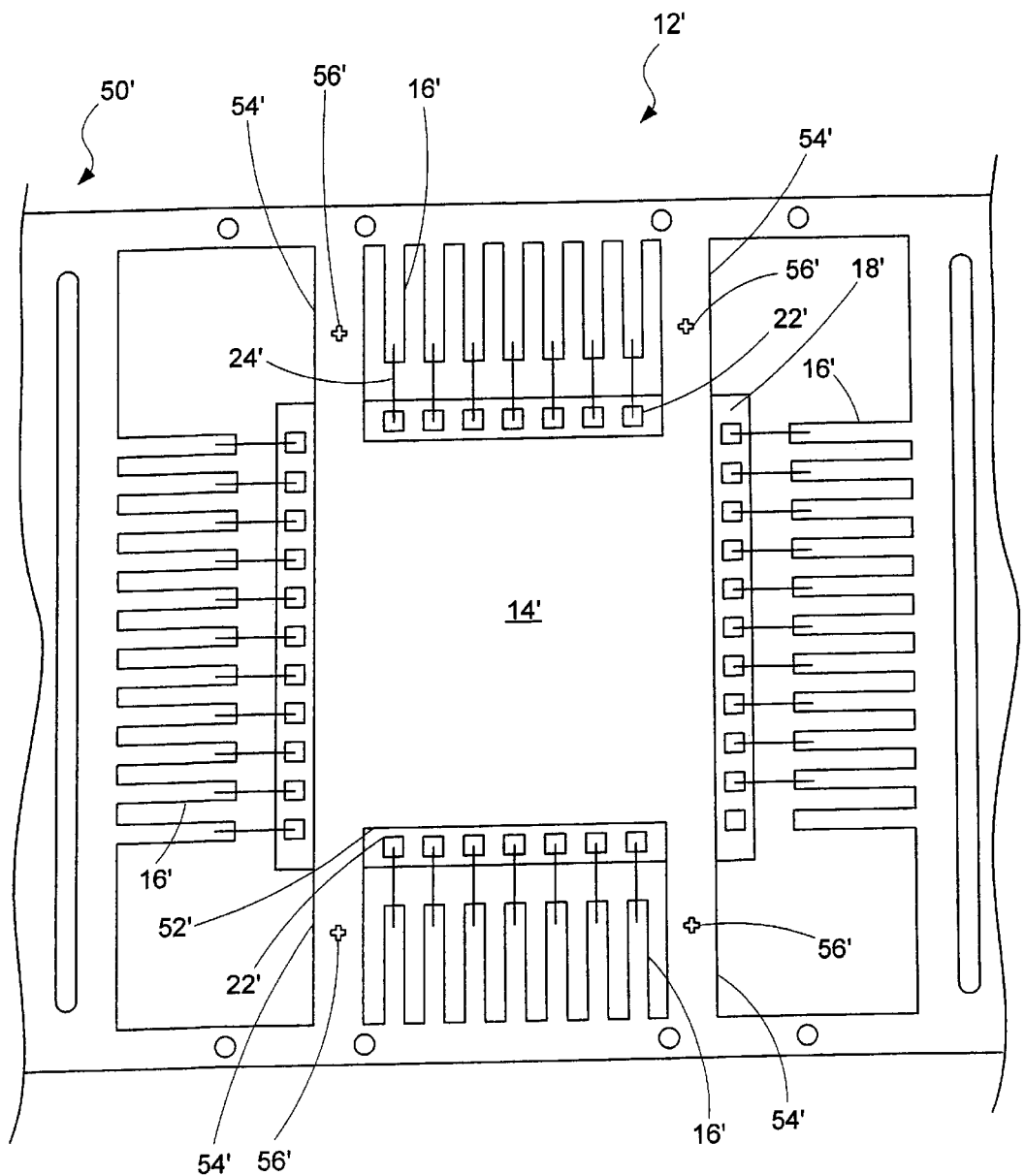
FIG. 4 shows a top elevational view of a lead frame having a semiconductor die attached to the bottom side thereof according. to another embodiment, of the present invention.
Figure 5:
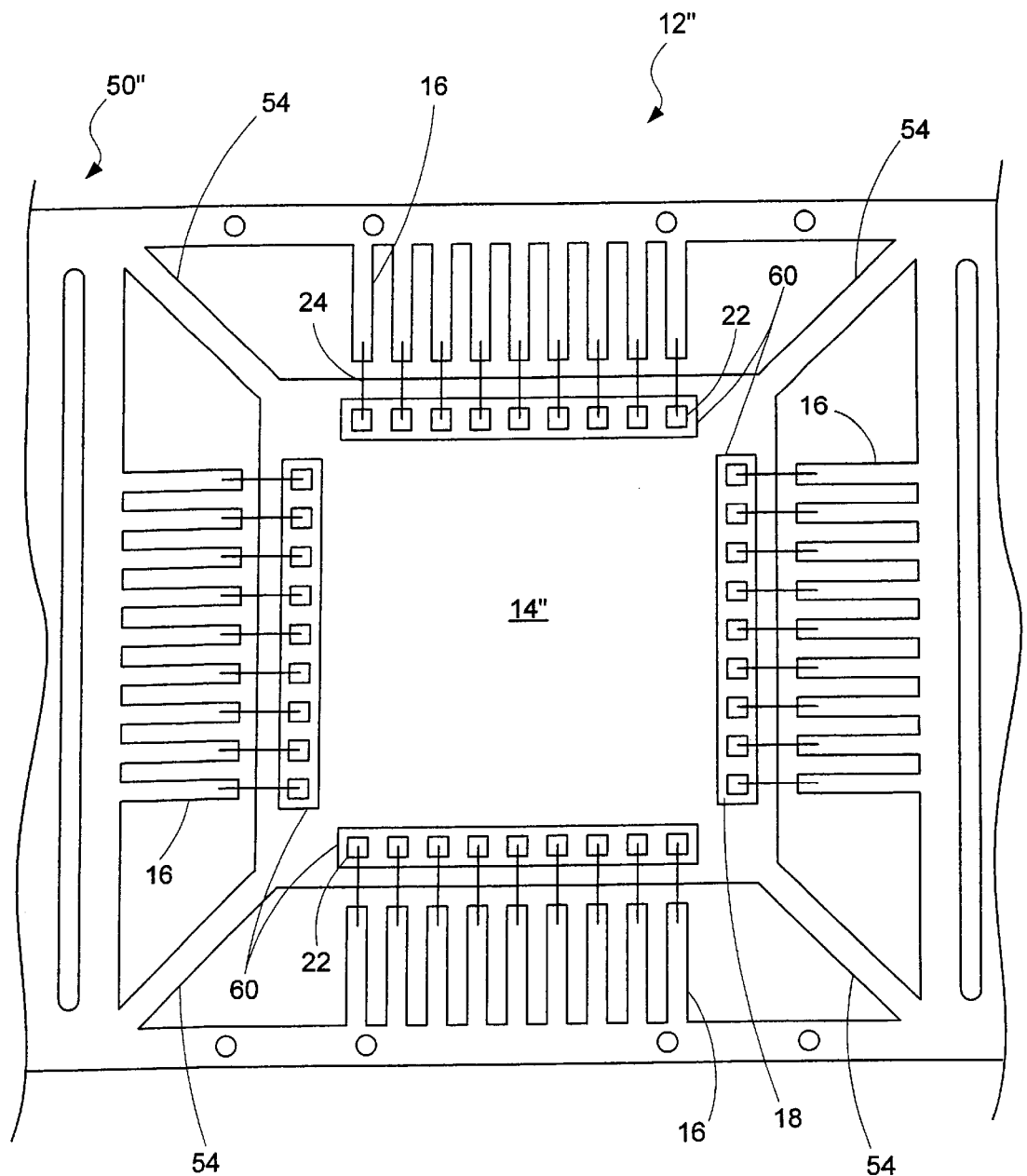
FIG. 5 shows a top elevational view of a lead frame having a semiconductor die attached to the bottom side thereof according to yet another embodiment of the present invention.

Referring now to FIGS. 3 through 5, various configurations of exemplary lead frames 12, 12' and 12" which may be utilized in the present invention are shown. Referring first to FIG. 3, a lead frame 12 is shown from a top elevational perspective along with a first semiconductor die 18 adhered to the underside of the die paddle 14. It is noted that the lead frame 12 is shown as an unexcised and untrimmed segment of a lead frame strip 50 as will be appreciated by those of ordinary skill in the art.

The lead frame 12 includes a die paddle 14 and a plurality of lead fingers 16 which are peripherally located relative to the first semiconductor die 18. The die paddle 14 is sized and configured to exhibit a smaller peripheral outline than the peripheral outline of the first semiconductor die 18 which is attached thereto. Such a die paddle 14 allows access to the bond pads 22 of the first semiconductor die 18 so as to not interfere with the wire bonds 24 or other electrical connections between the bond pads 22 and the lead fingers 16.

It may be desirable to maintain a minimum distance between the bond pads 22 and the peripheral edge 52 of the die paddle 14. For example, it may be desirable to maintain a distance of approximately 250 microns (approximately 0.010 inch) between the bond pads 22 and the peripheral edge 52 of the die paddle 14.

Further, it is noted that the tie bars 54 of the lead frame 12 are desirably located in what may be termed "stay out zones," meaning that the tie bars 54 are strategically located so that they do not interfere With the wire bonds 24 or other electrical connections extending between the bond pads 24 and the lead fingers 16. Thus, as seen in FIG. 3, the tie bars 54 extend substantially diagonally outwardly from corners of the die paddle 14 so that they do not cover or otherwise conceal the bond pads 24 of the first semiconductor die 18. Aside from supporting the die paddle 14 prior to excise and trim of the lead frame 12, the tie bars 54 also serve to transfer heat from the die paddle 14 to the external periphery of the dielectric material 40 (not shown in FIGS. 3–5).

It is noted that conventional COL-type lead frames include die paddles which exhibit a larger peripheral outline than the peripheral outline of the semiconductor die placed thereon. With such a conventional configuration, the peripheral edge of the die paddle may be utilized for alignment purposes when assembling a semiconductor die to the lead frame as well as during other processing steps associated with fabrication of the semiconductor device package 10. Thus, in the present invention if a die paddle 14 which exhibits a smaller peripheral outline than that of the first semiconductor die 18 is used, it may be desirable to incorporate alignment features 56 into the lead frame 12. Such alignment features 56 may include protrusions or cutouts at one or more locations on the lead frame 12 which will not be obscured by or interfere with the semiconductor dice 18 or other components of the semiconductor device package 10.

Referring to FIG. 4, another exemplary configuration of a lead frame 12' is shown as an unexcised and untrimmed segment of a lead frame strip 50' and has a semiconductor die 18' adhered to the underside thereof. The lead frame 12' includes a die paddle 14', which again exhibits a smaller peripheral outline than that of the first semiconductor die 18' so as to not interfere with the wire bonds 24' or other electrical connections between the bond pads 22' and the lead fingers 16'. The tie bars 54' are again located in "stay out zones," however, the tie bars 54' extend substantially perpendicularly from two opposing sides, and more particularly, from the peripheral edges 52' of the die paddle 14' rather than diagonally as shown in FIG. 3. Also, the alignment features 56' are shown to be cutouts or other markings as opposed to protrusions as shown in FIG. 3, although either protrusions or cutouts may be used with any of the embodiments described herein.

Referring now to FIG. 5, another exemplary configuration of a lead frame 12" is shown as an unexcised and untrimmed segment of a lead frame strip 50" having a first semiconductor die 18 adhered to the underside thereof. The die paddle 14" of the lead frame 12" is larger than the outline of the first semiconductor die 18 as with a more conventional COL-type lead frame. However, a plurality of openings 60, shown as channels, is formed adjacent to the peripheral edges of the die paddle 14". The openings 60 are sized, located and configured so as to provide access for the wire bonds 24 to the bond pads 22 through the openings 60. In such a configuration, the peripheral edges of the die paddle 14" may be used for alignment purposes in assembling and processing the semiconductor device package 10 (see FIGS. 1A and 1B), although the other alignment features may also be incorporated.

Figure 6A:
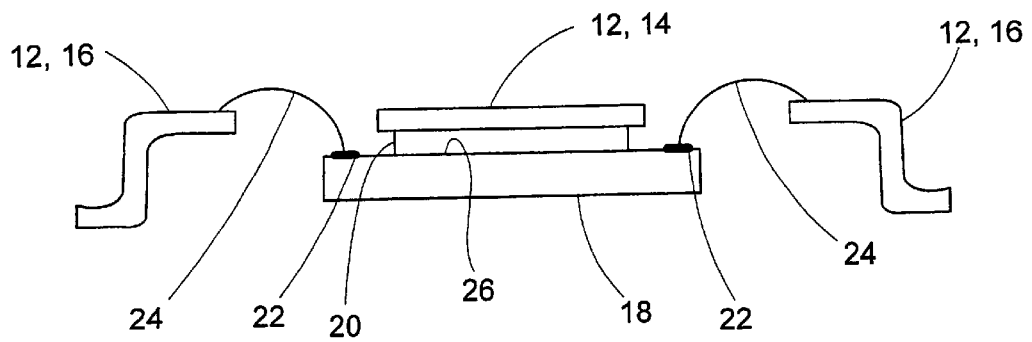
FIGS. 6A through 6C show partial cross-sectional views of a package at various stages of processing according to an embodiment of the present invention.
Figure 6B:
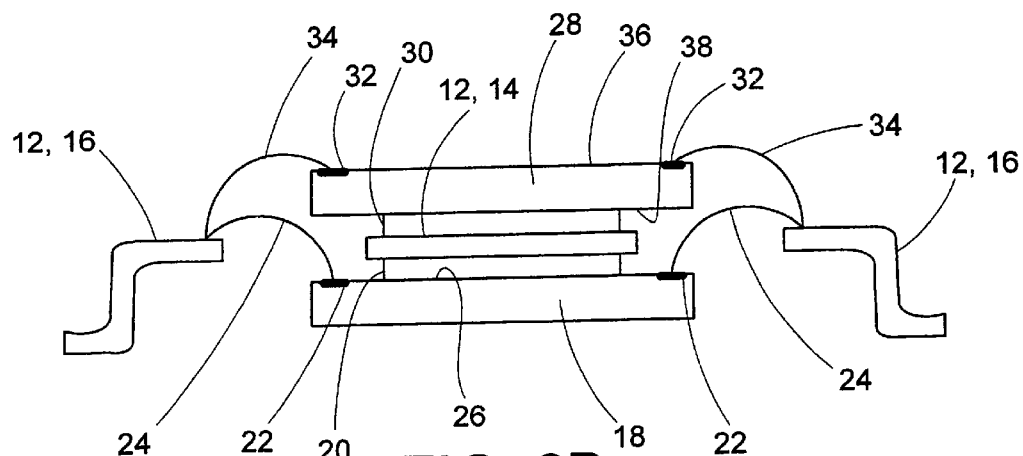
Figure 6C:
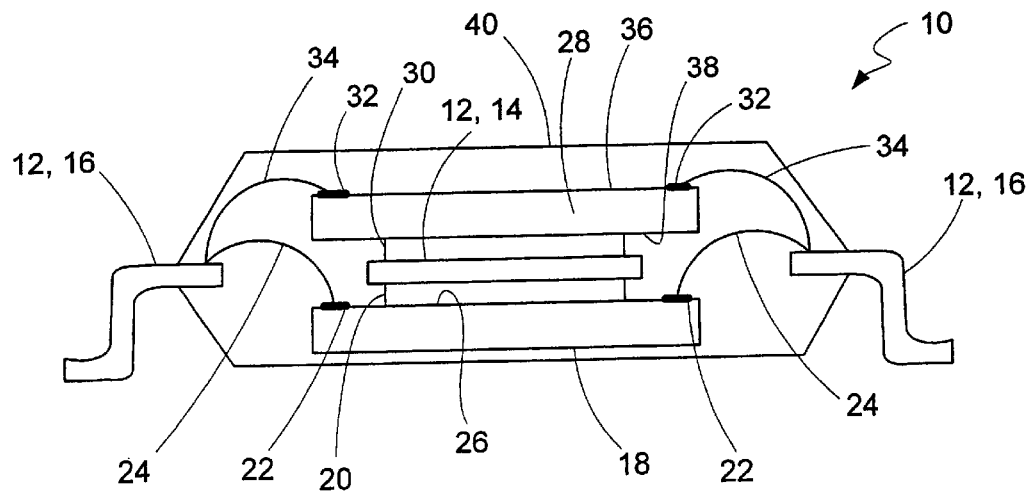

Referring now to FIGS. 6A through 6C, an exemplary method of assembling and fabricating the semiconductor package 10 of the present invention may be seen. Referring first to FIG. 6A, the first semiconductor die 18 is aligned with and the active surface 26 is adhered to the underside of the lead frame's die paddle 14. The wire bonds 24 are then formed and electrically coupled with the bond pads 22 of the first semiconductor die 18 and to the lead fingers 16.

Referring now to FIG. 6B, the second semiconductor die 28 is then aligned with and its back side 38 is adhered to the upper side of the lead frame's die paddle 14. The wire bonds 34 are then formed and electrically coupled with the bond pads 32 of the second semiconductor die 28 and to the lead fingers 16. It is noted that the wire bonds 24 are connected to the bond pads 22 of the first semiconductor die 18 prior to the adherence of the second semiconductor die 28 when the two semiconductor dice 18 and 28 are of similar size. However, if the second semiconductor die 28 is smaller in size than that of the first semiconductor die 18, it is possible to connect the wire bonds 24 to the bond pads 22 of the first semiconductor die 18 after adherence of the second semiconductor die 28 to the die paddle 14.

After the two semiconductor dice 18 and 28 are adhered to the die paddle 14 and the wire bonds 24 and 34 are properly connected with the bond pads 22 and 32 and with the lead fingers 16, the semiconductor dice 18 and 28, the die paddle 14 and a portion of the lead fingers 16 are encapsulated with a filled polymer dielectric material 40 as shown in FIG. 6C. While the exemplary method set forth and described with respect to FIGS. 6A and 6C depicts the lead frame 12 as already being excised and trimmed and formed, such is shown for purposes of clarity. It will be recognized by those of ordinary skill in the art that excising, trimming and forming the lead frame is a conventional act in forming semiconductor device packages.

It is noted, with respect to the above-described embodiments, that a semiconductor device package 10 which incorporates identical or substantially similar semiconductor dice 18 and 28 results in a thermally and mechanically balanced package. For example, the semiconductor dice 18 and 28 are symmetrically located about the die paddle 14 of the lead frame 12. Further, the semiconductor dice 18 and 28 are each thermally coupled to the die paddle 14 of the lead frame 12, resulting in more efficient dissipation of heat generated by such semiconductor dice 18 and 28. Such symmetry, both mechanically and thermally, may reduce the stress and associated material failure experienced within the dielectric material 40 of the semiconductor device package 10.

Figure 7:
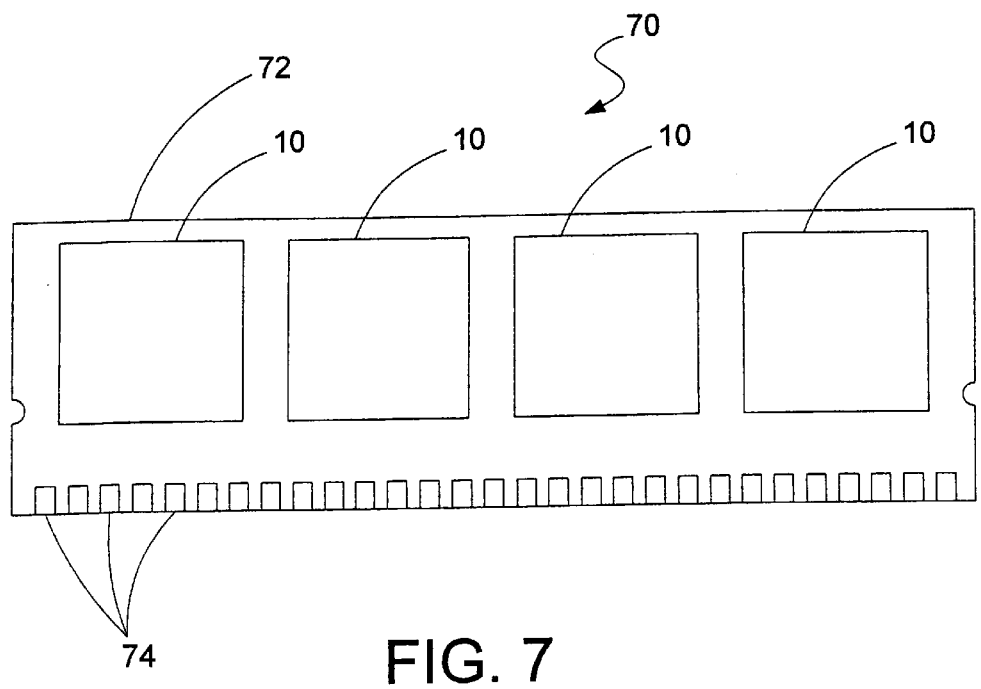
FIG. 7 shows a memory device incorporating a packaged semiconductor device according to an embodiment of the present invention.

Referring now to FIG. 7, a memory device 70, also referred to as a memory module, is shown which incorporates a semiconductor device package 10 according to the present invention. The memory device 70 includes a carrier substrate such as a printed circuit board 72 to which one or more semiconductor device packages 10 may be electrically and mechanically operably coupled therewith. A plurality of electrical connectors 74 is formed on the printed circuit board 72 to provide input and output connections from an external device, such as, for example, the motherboard of a computer, to the one or more semiconductor device packages 10.

Figure 8:
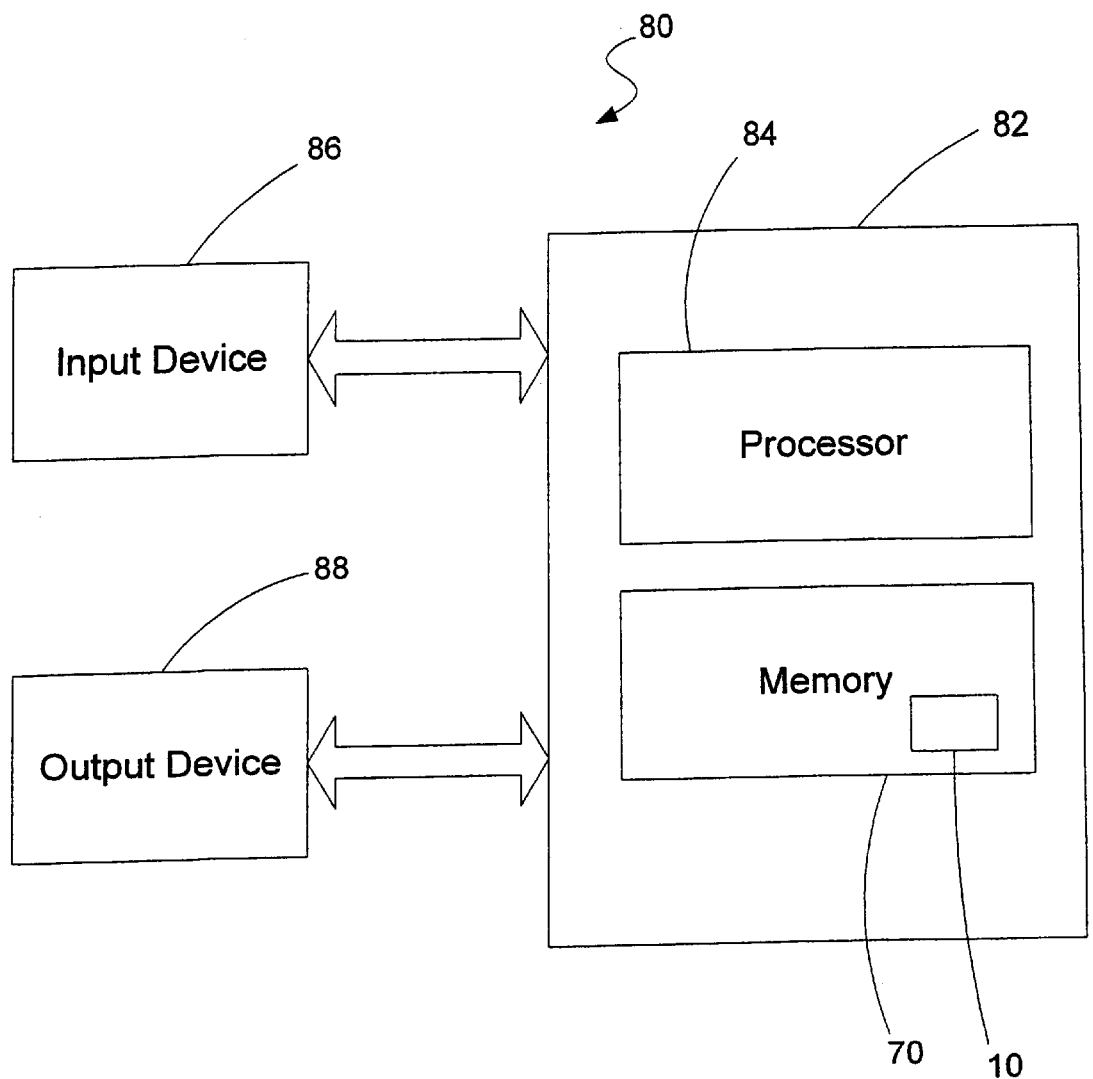
FIG. 8 is a schematic of a system utilizing the memory device of FIG. 7.

Referring now to FIG. 8, a computing system 80 is shown which includes a carrier substrate such as a printed circuit board 82 which may include, for example, a motherboard. The printed circuit board 82 may be operably coupled to at least one processor 84, such as, for example, a central processing unit (CPU) and at least one memory device 70. The memory device 70 may include one or more semiconductor device packages 10 such as described above. The printed circuit board 82 is operably coupled with at least one input device 86 such as, for example, a key board, a mouse, a sensor or another computing device. The printed circuit board 82 is also operably coupled with at least one output device 88 such as, for example, a printer, a monitor, an actuator or another computing device.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A semiconductor device package comprising:
   a lead frame including a die paddle and a plurality of lead fingers;
   a first semiconductor die having an active surface and a plurality of bond pads disposed on the active surface, wherein the active surface of the first semiconductor die is adhered to an underside of the die paddle, and wherein at least one of the plurality of bond pads is electrically connected to at least one lead finger of the plurality of lead fingers; and
   a second semiconductor die having an active surface, a surface opposing the active surface and a plurality of bond pads on the active surface, wherein the surface opposing the active surface is adhered to an upper side of the die paddle and wherein at least one of the plurality bond pads of the second semiconductor die is electrically connected to the at least one lead finger.

2. The semiconductor device package of claim 1, further comprising an amount of insulating material encapsulating the first semiconductor die, the second semiconductor die, the die paddle and a portion of each of the plurality of lead fingers.

3. The semiconductor device package of claim 1, wherein the die paddle exhibits a peripheral outline which is smaller than a peripheral outline of the first semiconductor die.

4. The semiconductor device package of claim 1, wherein the second semiconductor die is substantially identical to the first semiconductor die.

5. The semiconductor device package of claim 1, wherein the second semiconductor die is substantially the same size as the first semiconductor die.

6. The semiconductor device package of claim 1, wherein the second semiconductor die exhibits a smaller size than the first semiconductor die.

7. The semiconductor device package of claim 6, wherein the second semiconductor die exhibits substantially identical circuitry to that of the first semiconductor die.

8. The semiconductor device package of claim 1, wherein the at least one bond pad of the first semiconductor die corresponds in location on its respective semiconductor die with the at least one bond pad of the second semiconductor die and wherein the at least one bond pad of the first semiconductor die and the at least one bond pad of the second semiconductor die are electrically connected with a common lead finger of the plurality of lead fingers.

9. The semiconductor device package of claim 1, further comprising a volume of dielectric material encapsulating the first semiconductor die, the second semiconductor die, the die paddle and a portion of each of the plurality of lead fingers.

10. The semiconductor device package of claim 1, wherein at least one of the first semiconductor die and the second semiconductor die is adhered to the die paddle with a thermally conductive material.

11. The semiconductor device package of claim 1, wherein the lead frame further comprises at least one tie bar coupled with the die paddle and wherein the at least one tie bar is configured and located so as to pass through a stay out zone, remaining clear of any electrical interconnection between the plurality of bond pads of the first semiconductor die and the plurality of lead fingers.

12. The semiconductor device package of claim 1, further comprising at least one alignment feature formed in the lead frame.

13. The semiconductor device package of claim 12, wherein the at least one alignment feature includes a cutout in a portion of the lead frame.

14. The semiconductor device package of claim 12, wherein the at least one alignment feature includes a protuberance formed in a portion of the lead frame.

15. The semiconductor device package of claim 12, wherein the at least one alignment feature is formed in at least one tie bar of the lead frame.

16. The semiconductor device package of claim 1, wherein the die paddle defines at least one opening therein, the at least one opening being configured and located to provide access to the at least one bond pad of the plurality of bond pads.

17. A semiconductor device package comprising:
   a lead frame including a centrally located die paddle and a plurality of lead fingers arranged about a periphery of the die paddle;
   a first semiconductor die having an active surface and a plurality of bond pads disposed on the active surface, wherein a portion of the active surface of the first semiconductor die is adhered to an underside of the die paddle;
   a second semiconductor die having an active surface, a second opposing surface, and a plurality of bond pads disposed on the active surface thereof, wherein the second opposing surface of the second semiconductor die is adhered to an upper side of the die paddle;
   a first electrical connection between a first bond pad of the plurality of bond pads of the first semiconductor die and a first lead finger of the plurality of lead fingers;
   a second electrical connection between a first bond pad of the plurality of bond pads of the second semiconductor die and a second lead finger of the plurality of lead fingers.

18. The semiconductor device package of claim 17, further comprising a volume of dielectric material encapsulating the first semiconductor die, the second semiconductor die, the die paddle of the lead frame and a portion of each of the plurality of lead fingers.

19. The semiconductor device package of claim 18, wherein the first electrical connection and the second electrical connection each comprise a wire bond.

20. The semiconductor device package of claim 19, wherein the active surface of the first semiconductor die is adhered to the underside of the die paddle with an amount of adhesive comprising a thermally conductive material.

21. The semiconductor device package of claim 20, wherein the second opposing surface of the second semiconductor die is adhered to the upper side of the die paddle with another amount of adhesive comprising a thermally conductive material.

22. The semiconductor device package of claim 19, wherein the first semiconductor die is substantially identical to the second semiconductor die.

23. The semiconductor device package of claim 19, wherein the die paddle exhibits a peripheral outline which is smaller than a peripheral outline of the first semiconductor die.

24. The semiconductor device package of claim 23, further comprising at least one alignment feature formed in a portion of the lead frame.

25. The semiconductor device package of claim 24, further comprising at least one tie bar extending from the die paddle, wherein the at least one alignment feature is formed in the at least one tie bar.

26. The semiconductor device package of claim 17, wherein the die paddle defines at least one opening therein, wherein the first electrical connection passes through the at least one opening.

27. A method of forming a semiconductor device package, the method comprising:
providing a lead frame having a die paddle and a plurality of lead fingers;
adhering an active surface of a first semiconductor die to an underside of the die paddle;
electrically connecting at least one of a plurality of bond pads formed on the active surface of the first semiconductor die to a first lead finger of the plurality of lead fingers;
adhering a surface which is opposed to an active surface of a second semiconductor die to an upper side of the die paddle; and
electrically connecting at least one of a plurality of bond pads formed on the active surface of the second semiconductor die to a second lead finger of the plurality of lead fingers.

28. The method according to claim 27, further comprising encapsulating the first semiconductor die, the second semiconductor die, the die paddle and a portion of each of the plurality of lead fingers with a dielectric material.

29. The method according to claim 27, further comprising forming the die paddle with a peripheral outline which is smaller than a peripheral outline of the first semiconductor die.

30. The method according to claim 27, further comprising forming at least one alignment mark in a portion of the lead frame.

31. The method according to claim 30, wherein forming at least one alignment mark includes forming the at least one alignment mark in a tie bar which extends from the die paddle.

32. The method according to claim 27, wherein adhering the active surface of the first semiconductor die further includes disposing a thermally conductive material between the active surface of the first semiconductor die and the die paddle.

33. The method according to claim 27, further comprising forming at least one opening in the die paddle and locating the at least one opening so as to provide access to at least one bond pad of the plurality of bond pads.

34. A memory device comprising:
a carrier substrate;
a plurality of electrical contacts coupled with electrical circuitry formed in the carrier substrate; and
at least one semiconductor device package coupled with the electrical circuitry in the carrier substrate, the at least one semiconductor device package comprising:
a lead frame including a die paddle and a plurality of lead fingers;
a first semiconductor die having an active surface and a plurality of bond pads disposed on the active surface, wherein the active surface of the first semiconductor die is adhered to an underside of the die paddle, and wherein at least one of the plurality of bond pads is electrically connected to at least one of the plurality of lead fingers; and
a second semiconductor die having an active surface, a surface opposing the active surface and a plurality of bond pads on the active surface, wherein the surface opposing the active surface is adhered to an upper side of the die paddle and wherein at least one of the plurality bond pads of the second semiconductor die is electrically connected to the at least one lead finger.

35. The memory device of claim 34, wherein the at least one semiconductor device package further comprises an amount of insulating material encapsulating the first semiconductor die, the second semiconductor die, the die paddle and a portion of each of the plurality of lead fingers.

36. The memory device of claim 35, wherein the second semiconductor die is substantially identical to the first semiconductor die.

37. The memory device of claim 36, wherein the at least one bond pad of the first semiconductor die corresponds in location on its respective semiconductor die with the at least one bond pad of the second semiconductor die and wherein the at least one bond pad of the first semiconductor die and the at least one bond pad of the second semiconductor die are electrically connected with a common lead finger of the plurality of lead fingers.

38. The memory device of claim 35, wherein at least one of the first semiconductor die and the second semiconductor die are adhered to the die paddle with a thermally conductive material.

39. The memory device of claim 35, wherein the lead frame further comprises at least one tie bar coupled with the die paddle and wherein the at least one tie bar is configured and located so as to pass through a stay out zone, remaining clear of any electrical interconnection between the plurality of bond pads of the first semiconductor die and the plurality of lead fingers.

40. The memory device of claim 39, further comprising at least one alignment feature formed in the at least one tie bar.

41. The memory device of claim 35, further comprising at least one alignment feature formed in a portion of the lead frame.

42. A computing system comprising:
a carrier substrate;
a processor operably coupled to the carrier substrate;
at least one input device operably coupled with the carrier substrate;
at least one output device operably coupled with the carrier substrate; and a memory device operably coupled to the carrier substrate, the memory device including at least one semiconductor device package, the at least one semiconductor device package comprising:
  a lead frame including a die paddle and a plurality of lead fingers; and
  a first semiconductor die having an active surface and a plurality of bond pads disposed on the active surface, wherein the active surface of the first semiconductor die is adhered to an underside of the die paddle, and wherein at least one of the plurality of bond pads is electrically connected to at least one of the plurality of lead fingers; and
  a second semiconductor die having an active surface, a surface opposing the active surface and a plurality of bond pads on the active surface, wherein the surface opposing the active surface is adhered to an upper side of the die paddle and wherein at least one of the plurality bond pads of the second semiconductor die is electrically connected to the at least one lead finger.

43. The computing system of claim 42, wherein the at least one semiconductor device package further comprises a volume of dielectric material encapsulating the first semiconductor die, the second semiconductor die, the die paddle and a portion of each of the plurality of lead fingers.

44. The computing system of claim 43, wherein the second semiconductor die is substantially identical to the first semiconductor die.

45. The computing system of claim 44, wherein the at least one bond pad of the first semiconductor die corresponds in location on its respective semiconductor die with the at least one bond pad of the second semiconductor die and wherein the at least one bond pad of the first semiconductor die and the at least one bond pad of the second semiconductor die are electrically connected with a common lead finger of the plurality of lead fingers.

46. The computing system of claim 43, wherein the first semiconductor die and the second semiconductor die are adhered to the die paddle with a thermally conductive material.

47. The computing system of claim 43, wherein the lead frame further comprises at least one tie bar coupled with the die paddle and wherein the at least one tie bar is configured and located so as to pass through a stay out zone, remaining clear of any electrical interconnection between the plurality of bond pads of the first semiconductor die and the plurality of lead fingers.

48. The computing system of claim 47, further comprising at least one alignment feature formed in the at least one tie bar.

49. The computing system of claim 43, further comprising at least one alignment feature formed in a portion of the lead frame.

* * * * *